(12) United States Patent
Steckemetz

(10) Patent No.: US 8,590,696 B2
(45) Date of Patent: Nov. 26, 2013

(54) TRANSPORT APPARATUS

(75) Inventor: Stefan Steckemetz, Freiberg (DE)

(73) Assignee: Deutsche Cell GmbH, Freiberg (DE)

( * ) Notice: Subject to any disclaimer, the term of this patent is extended or adjusted under 35 U.S.C. 154(b) by 452 days.

(21) Appl. No.: 12/889,520

(22) Filed: Sep. 24, 2010

(65) Prior Publication Data

US 2011/0068092 A1   Mar. 24, 2011

(30) Foreign Application Priority Data

Sep. 24, 2009   (DE) .................. 10 2009 042 912

(51) Int. Cl.
*B65G 15/42*   (2006.01)

(52) U.S. Cl.
USPC .................................................. 198/803.14

(58) Field of Classification Search
USPC ............... 198/803.01, 803.14, 867.08, 465.1, 198/465.2, 803.11, 817
See application file for complete search history.

(56) References Cited

U.S. PATENT DOCUMENTS

| | | | |
|---|---|---|---|
| 3,085,676 A * | 4/1963 | Hinchcliffe | 198/803.14 |
| 5,115,905 A * | 5/1992 | Hollinger, II | 198/465.1 |
| 5,248,028 A | 9/1993 | Weiblen et al. | |
| 5,586,642 A * | 12/1996 | Hawkins | 198/803.11 |
| 6,241,079 B1 * | 6/2001 | Weber et al. | 198/817 |
| 6,321,904 B1 * | 11/2001 | Mitchell | 198/867.11 |
| 6,625,835 B1 * | 9/2003 | Frost et al. | 15/77 |
| 7,717,253 B2 * | 5/2010 | Lord | 198/803.11 |

FOREIGN PATENT DOCUMENTS

| | | |
|---|---|---|
| DE | 4114639 A1 | 12/1992 |
| JP | 2001225292 A | 8/2001 |
| JP | 2002203888 A | 7/2002 |

OTHER PUBLICATIONS

English abstract of JP 2001225292 A.
English abstract of JP 2002203888 A.

* cited by examiner

*Primary Examiner* — James R Bidwell

(57) ABSTRACT

In various embodiments, an apparatus for transporting wafers is provided. The apparatus may include a transport belt configured to transport wafers in a transport direction; wherein the transport belt is provided with supports configured to support the wafers to be transported; wherein the supports are provided with at least one bearing element for compensating for relative movements between the transport belt and the wafer.

12 Claims, 3 Drawing Sheets

TRANSPORT APPARATUS

CROSS-REFERENCE TO RELATED APPLICATION

This application claims priority to German Patent Application Serial No. 10 2009 042 912.3, which was filed Sep. 24, 2009, and is incorporated herein by reference in its entirety.

TECHNICAL FIELD

Various embodiments relate to an apparatus for transporting wafers.

BACKGROUND

In the production of solar cells, the wafers as a rule pass through a process chain having a plurality of stations. To this end, it is advantageous to use automated transport devices. In some sections of the process chain, it has to be ensured that a contact between the wafers and the transport device is avoided. To this end, the wafers are held, for example, on two edges which lie opposite one another. It may be disadvantageous here that the wafers are often damaged at the wafer edges. Moreover, there is the risk of contaminating the wafers in the region of their edges.

SUMMARY

In various embodiments, an apparatus for transporting wafers is provided. The apparatus may include a transport belt configured to transport wafers in a transport direction; wherein the transport belt is provided with supports configured to support the wafers to be transported; wherein the supports are provided with at least one bearing element for compensating for relative movements between the transport belt and the wafer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Various embodiments improve a transport apparatus for wafers.

Various embodiments provide rigid support structures with rotatably mounted bearing means. The wafer edges are protected against damage and contamination by the rotatably mounted bearing means.

Connecting regions which are arranged oblique with respect to the horizontal direction may serve to align, e.g. to centre, the wafers on the transport device. Moreover, the bearing surface area of the wafers may be kept low as a result.

By way of bearing elements made from a heat-resistant material, the transport apparatus according to various embodiments may also be used in conveyor furnaces.

Bearing elements with a surface made from ceramic or quartz make contamination-free transport of the wafers possible. Both can also be provided.

The rotatable mounting of the bearing elements in various embodiments may avoid high frictional forces between the support structure and the wafer edges in the case of a relative movement between them. The bearing elements may be rotated only in one rotational direction, while a rotation in the opposite direction is prevented by a suitable mechanism. This may avoid the wafers unintentionally slipping back counter to the transport direction.

Figure 1:
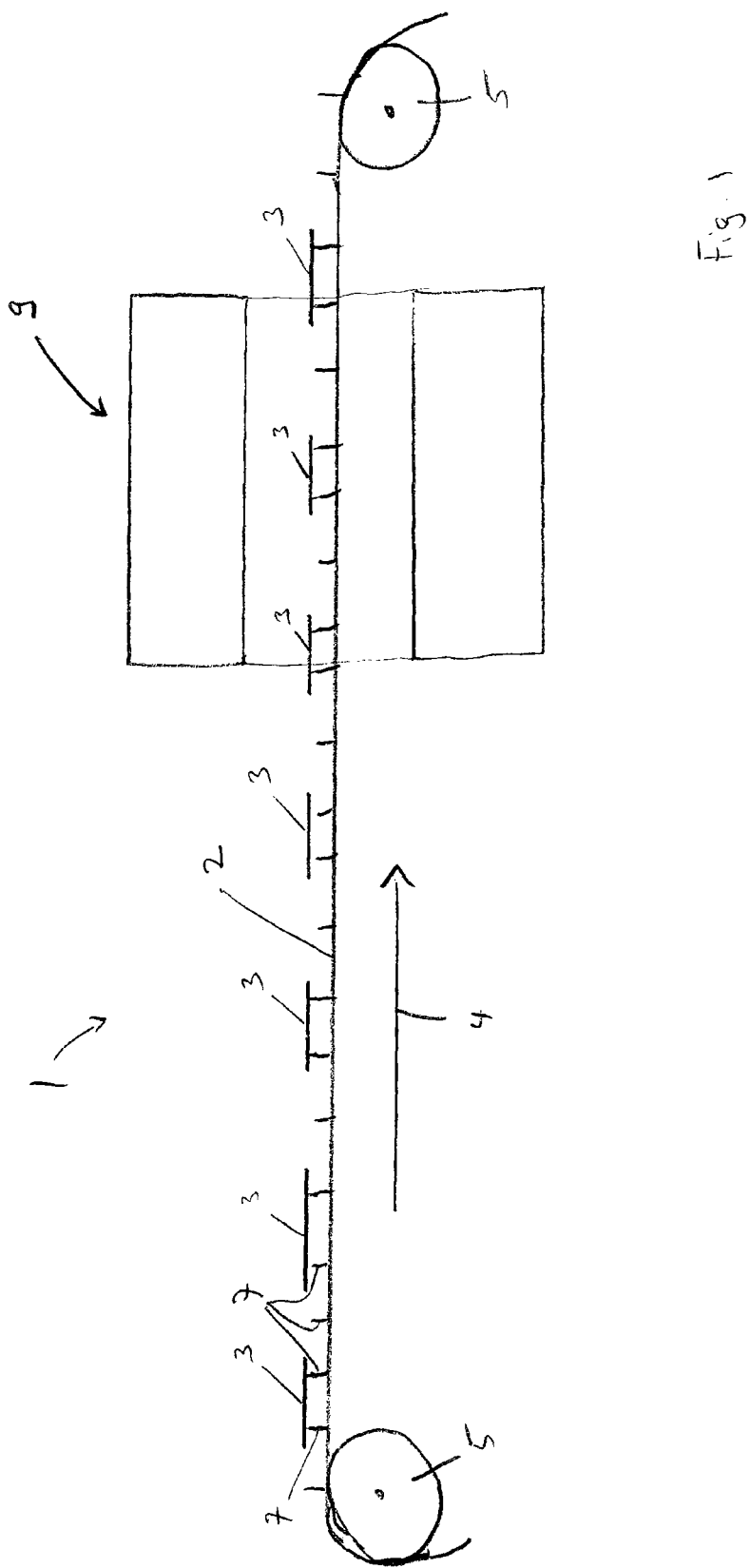
FIG. 1 shows a diagrammatic side view of a transport apparatus in accordance with various embodiments.
Figure 2:
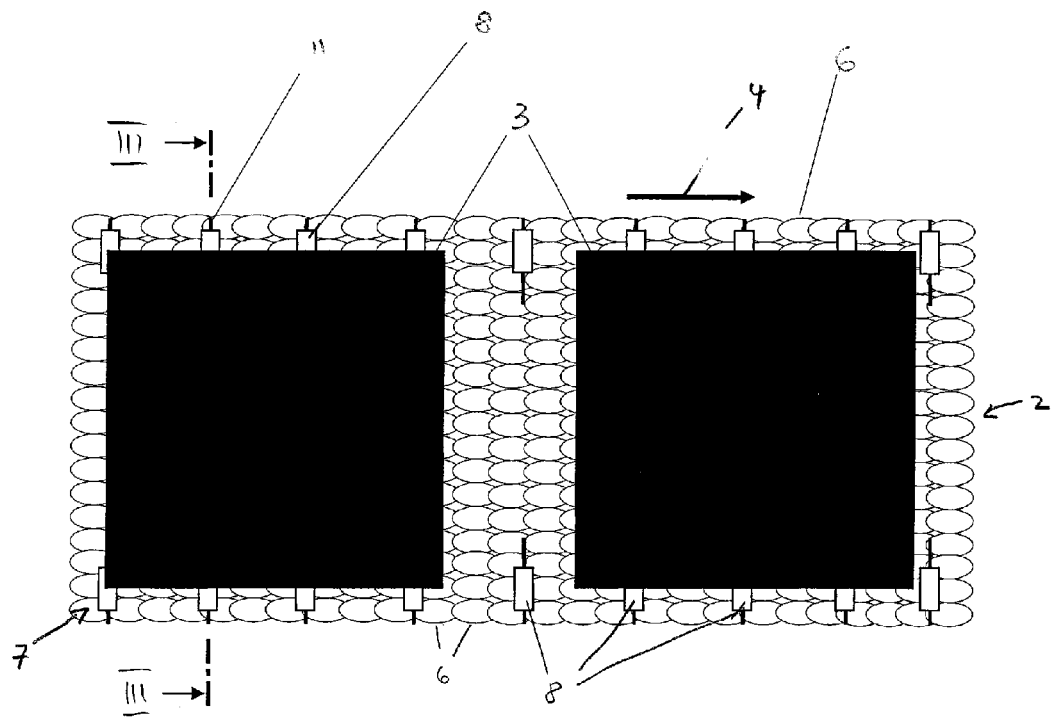
FIG. 2 shows a view from above of the transport apparatus according to FIG. 1 in accordance with various embodiments.
Figure 3:
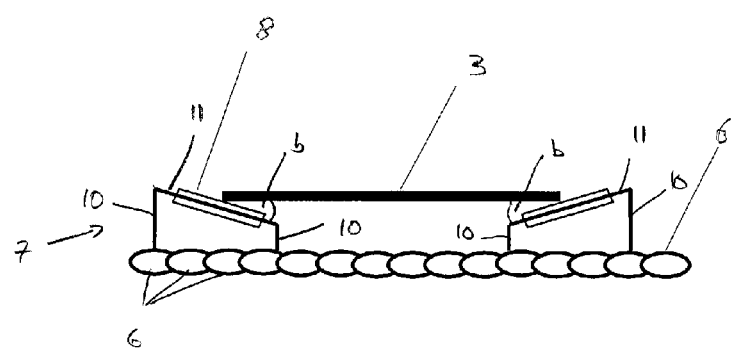
FIG. 3 shows a sectional illustration along the line III-III of the transport apparatus according to FIG. 2 in accordance with various embodiments.

In the following text, a first embodiment will be described with reference to FIGS. 1 to 3. A transport apparatus 1 for transporting wafers includes a transport device 2 for transporting wafers 3 in a transport direction 4. The transport apparatus 1 serves, for example, to transport the wafers 3 through a conveyor furnace 9. In various embodiments, a transport belt may be provided as transport device 2. The transport belt may be of endless configuration. It is in various embodiments mounted on rollers 5 which are mounted such that they can be rotated, e.g. such that they can be driven rotationally. The transport belt may include a plurality or a multiplicity of chain links 6 which are connected at least partially to one another. The chain links 6 may form a contiguous network. However, it is likewise conceivable to configure the transport belt from chain links 6 which are connected to one another in the manner of a rope ladder. A transport belt of this type can be guided flexibly over the rollers 5. Transport along a curved track is also possible with a transport belt of this type which is constructed from chain links 6.

The transport belt may be provided with supports which are configured as support structures 7 for supporting the wafers 3 to be transported. There is provision according to various embodiments for the support structures 7 to be provided, e.g. in each case, with at least one bearing element 8 for protecting the wafers 3.

The support structures 7 may include, e.g. in each case, two supporting regions 10, which project from the transport device 2, and a connecting region 11. The supporting regions 10 may be arranged in the vertical direction. The connecting regions 11 may be arranged oblique with respect to the horizontal direction. They may enclose an angle b in the range from 1° to 30°, e.g. in the range from 5° to 10°, with the horizontal direction. The supporting regions 10 and the connecting regions 11 may be arranged perpendicularly with respect to the transport direction 4.

The support structures 7 may be arranged in pairs on the transport device 2. The two support structures 7 which belong together are spaced apart from one another in the perpendicular direction with respect to the transport direction 4. Here, the spacing between the support structures 7 which belong together in the perpendicular direction with respect to the transport direction 4 is smaller than the width of the wafers 3 to be transported, e.g. smaller than half the width of the wafers 3 to be transported. The support structures 7 are arranged, in various embodiments, e.g. in each case, in the region of the lateral edge of the transport belt. Support structures which are adjacent in the transport direction 4 are at a spacing which is smaller than the width of the wafers 3 to be transported, e.g. smaller than half the width of the wafers 3 to be transported. The supports which are configured as support structures 7 have, e.g. in each case, at least one supporting region 10 which projects from the transport device 2. This also applies to the further embodiment which will be described in the following text. Supporting regions which project from the transport device 2 ensure that a contact between the wafers 3 and the transport device 2 is avoided.

The inclination of the connecting regions 11 is such that their spacing from the transport belt on the inner side, that is to say the side which faces the respectively associated support structure 7, is smaller than on the outer side. On account of the inclination of the connecting regions 11, the bearing elements 8 which are arranged on them have a surface which extends oblique with respect to the horizontal direction.

The bearing elements 8 are of hollow-cylindrical shape. They are arranged around the connecting regions 11. In various embodiments, they are mounted rotatably on the connecting regions 11. There can be provision here to mount the bearing elements 8 such that they can be rotated only in one rotational direction. The capability of the bearing elements 8 to rotate in the opposite direction is prevented here by a suitable mechanism.

The bearing elements 8 are in various embodiments configured in one piece. In the direction of their longitudinal axis, they have a length in the range from 1 cm to 10 cm, e.g. in the range from 2 cm to 5 cm.

The bearing elements 8 may be made from a heat-resistant material. They may have a surface made from ceramic and/or quartz. They may also be made completely from ceramic and/or quartz. In order to avoid the wafers 3 slipping perpendicularly with respect to the transport direction 4, the bearing elements 8 may have a profiled surface.

In the following text, the function of the apparatus according to various embodiments will be described. In order to transport the wafers 3, the latter are placed onto the support structures 7 which are provided with the bearing elements 8. Here, the wafers 3 come into contact with the bearing elements 8 exclusively in the region of their edges. The wafer edges lie, e.g. in each case, on the rotatably mounted bearing elements 8. Direct contact with the rigid supporting regions 10 or the rigid connecting regions 11 is avoided as a result.

If, for example, a relative movement occurs between the wafers and the transport device 2 when the wafers 3 are applied to the transport apparatus 1, the wafers 3 can roll on the rotatably mounted bearing elements 8. As a result, high frictional forces between the support structures 7 and the wafer edges are avoided. Moreover, the wear of the support structures 7 may be reduced.

Figure 4:
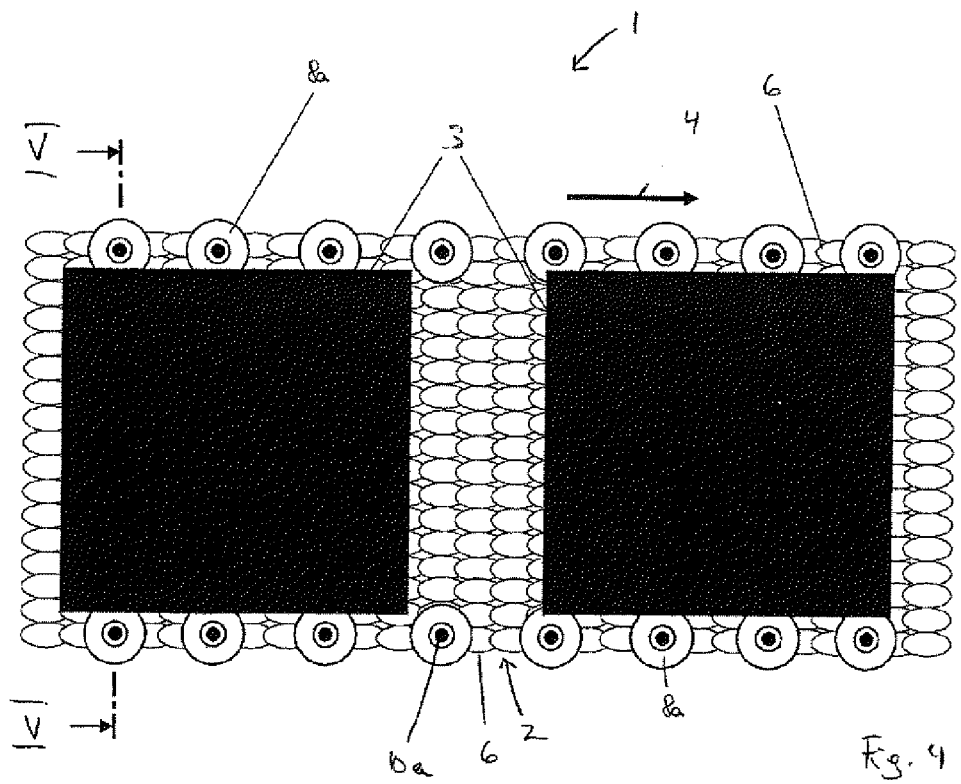
FIG. 4 shows a view from above of a further embodiment.
Figure 5:
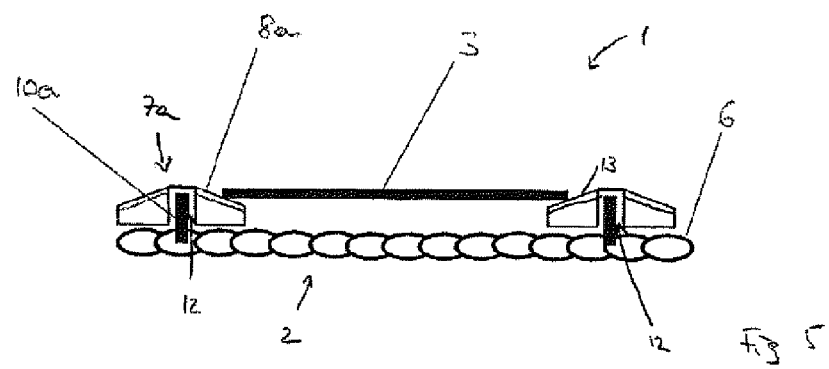
FIG. 5 shows a sectional illustration along the line V-V of the transport apparatus according to FIG. 4 in accordance with various embodiments.

In the following text, a further embodiment will be described with reference to FIGS. 4 and 5. Identical parts are given the same reference numerals as in the first embodiment, to the description of which reference is made. Functionally equivalent but structurally different parts are given the same reference numerals with an "a" added behind. According to the second embodiment, the support structures 7a have, e.g. in each case, only one supporting region 10a. The supporting region 10a is configured as a vertical pin, on which, e.g. in each case, a plate-like shaped bearing element 8a is mounted rotatably. The bearing elements 8a are of rotationally symmetrical configuration. They have a central recess 12. They are arranged on the supporting regions 10a of the support structures 7a in such a way that the supporting regions 10a protrude into the recesses 12. The recesses 12 serve to mount the bearing elements 8a on the supporting regions 10a. Low-friction rotatability of the bearing elements 8a can be achieved by suitable configuration of the recesses 12 and/or the supporting regions 10a. To this end, the supporting regions 10a may be configured to taper conically in each case, for example, in the region of their upper, free end.

The bearing elements 8a may have a thickness which decreases in the radial direction. As in the first embodiment, they therefore may have a surface which extends oblique with respect to the horizontal direction.

The bearing elements 8a are preferably made from ceramic and/or quartz. In various embodiments, they may have a quartz layer 13 on their surface.

In various embodiments, a method for thermally treating a wafer is provided. The method may include transporting a wafer on a support of a transport belt in a transport direction, wherein the support is provided, e.g. in each case, with at least one bearing element for compensating for relative movements between the transport belt and the wafer; and thermally treating the transported wafer.

In an implementation of various embodiments, the wafer may be thermally treated while being transported in the transport direction.

In an implementation of various embodiments, the transporting the wafer may include transporting the wafer through a conveyor furnace.

In an implementation of various embodiments, the transporting the wafer may include transporting a plurality of wafers on a plurality of bearing elements of a plurality of supports of a transport belt in the transport direction.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An apparatus for transporting wafers, the apparatus comprising: a transport belt configured to transport wafers in a transport direction; wherein the transport belt is provided with supports configured to support the wafers to be transported; wherein the supports are provided with at least one bearing element for compensating for relative movements between the transport belt and the wafer, wherein the bearing elements are mounted rotatably.

2. The apparatus of claim 1, wherein the bearing elements are made from a heat-resistant non-metal.

3. The apparatus of claim 1, wherein, on their surface, the bearing elements are made at least partially from ceramic or quartz.

4. The apparatus of claim 3, wherein, on their surface, the bearing elements are made completely from ceramic or quartz.

5. The apparatus of claim 1, wherein the bearing elements are mounted such that they can be rotated only in one rotational direction.

6. The apparatus of claim 1, wherein the bearing elements have in each case a surface which extends at least partially in regions oblique with respect to the horizontal direction.

7. The apparatus of claim 1, wherein the supports have in each case one connecting region which is arranged at least partially in sections oblique with respect to the horizontal direction.

8. The apparatus of claim 1, wherein the bearing elements are of hollow-cylindrical shape.

9. The apparatus of claim 1, wherein the bearing elements are arranged around a connecting region.

10. The apparatus of claim 1, wherein the bearing elements are of plate-like shape.

11. The apparatus of claim 1, wherein the bearing elements are arranged on a supporting region.

12. The apparatus of claim 1, wherein the transport belt has a plurality of chain links which are connected at least partially to one another.

\* \* \* \* \*